United States Patent
Cook et al.

(10) Patent No.: US 6,287,635 B1
(45) Date of Patent: Sep. 11, 2001

(54) HIGH RATE SILICON DEPOSITION METHOD AT LOW PRESSURES

(75) Inventors: Robert C. Cook; Daniel L. Brors, both of Livermore, CA (US)

(73) Assignee: Torrex Equipment Corp., Livermore, CA (US)

( * ) Notice: Subject to any disclaimer, the term of this patent is extended or adjusted under 35 U.S.C. 154(b) by 0 days.

(21) Appl. No.: 09/396,588

(22) Filed: Sep. 15, 1999

Related U.S. Application Data (63) Continuation-in-part of application No. 09/228,840, filed on Jan. 12, 1999, which is a continuation-in-part of application No. 09/228,835, filed on Jan. 12, 1999, now Pat. No. 6,167,837, which is a continuation-in-part of application No. 08/909,461, filed on Aug. 11, 1997
(60) Provisional application No. 60/100,594, filed on Sep. 16, 1998, provisional application No. 60/071,572, filed on Jan. 15, 1998, and provisional application No. 60/071,571, filed on Jan. 15, 1998.

(51) Int. Cl.$^7$ .................................................. C23C 16/24
(52) U.S. Cl. ............................. 427/255.18; 427/255.27; 427/255.393; 438/680; 438/758
(58) Field of Search ........................ 427/255.18, 255.27, 427/255.393, 255.5; 438/680, 758

(56) References Cited

U.S. PATENT DOCUMENTS 4,976,996 * 12/1990 Monowski et al. .
5,551,985 * 9/1996 Brors et al. .

OTHER PUBLICATIONS

Pierson, Handbook of Chemical Vapor Deposition, Noyes Publications, Park Ridge, New Jersey, USA, (1992), pp. 184–185 (no month).*

* cited by examiner

*Primary Examiner*—Timothy Meeks
(74) *Attorney, Agent, or Firm*—Pillsbury Winthrop; David H. Jaffer (57) ABSTRACT

A method for high rate silicon deposition at low pressures, including a method of operating a CVD reactor having a high degree of temperature and gas flow uniformity, the method of operation providing a novel combination of wafer temperature, gas flow and chamber pressure. According to the method, a substrate is placed in a vacuum chamber wherein a reactant gas is provided at a high velocity in parallel with the substrate via a plurality of temperature controlled gas injectors providing a condition wherein the deposition rate is only limited by the rate of delivery of unreacted gas to the substrate surface and the rate of removal of reaction byproducts. The novel combination of process conditions moves the reaction at the wafer surface into the regime where the deposition rate exceeds the crystallization rate, resulting in very small crystal growth and therefore a very smooth polysilicon film with a surface roughness on the order of 5–7 nm for films 2500 angstroms thick. The process is configured to operate below what is known as the "transition" temperature, at which level each layer of film is deposited in an amorphous form and then crystallizes as the deposition proceeds because of the lower energy of the polycrystalline structure. As a result, the silicon film is crystalline near the interface between the deposited material and the wafer surface, and amorphous near the top surface of the deposited material, resulting in improved surface smoothness.

19 Claims, 10 Drawing Sheets

PROCESS SPECIFICATIONS

SILANE FLOW: 250 - 700 SCCM

CHAMBER PRESSURE: 200 - 750 mTORR

GAS VELOCITY: > 100 CM/SEC

WAFER TEMPERATURE: 550°C - 700C°

SUBSTRATE ROTATION: 5 RPM

FIG. 7  Silicon Deposition Rate versus Pressure

HIGH RATE SILICON DEPOSITION METHOD AT LOW PRESSURES

This application claims the benefit of U.S. Provisional Application No. 60/100,594 filed Sep. 16, 1998, and is a continuation-in-part of: U.S. patent application Ser. No. 08/909,461 filed Aug. 11, 1997; U.S. patent application Ser. No. 09/228,835 filed Jan. 12, 1999, now U.S. Pat. No. 6,167,837 (which claims the benefit of U.S. Provisional Application No. 60/071,572 filed Jan. 15, 1998); and U.S. patent application Ser. No. 09/228,840 filed Jan. 12, 1999 (which claims the benefit of U.S. Provisional Application No. 60/071,571 filed Jan. 15, 1998).

BACKGROUND OF THE INVENTION

1. Field of the Invention

The present invention relates generally to methods for chemical vapor deposition (CVD) of undoped and doped silicon, and more particularly to a method for CVD of undoped and doped silicon employing a novel combination of flow rate, temperature and pressure to achieve improved film properties at a high rate of deposition at low pressure.

2. Brief Description of the Prior Art

Amorphous, polycrystalline and epitaxial silicon are used in the manufacturing of semiconductor devices and deposited onto substrates (i.e. wafers) by chemical vapor deposition. Such processes are carried out in a variety of commercially available hot wall and cold wall reactors. Deposition is accomplished by placing a substrate in a vacuum chamber, heating the substrate and introducing silane or any similar precursor such as disilane, dichlorosilane, silicon tetrachloride and the like, with or without other gases. Deposition rates of approximately 30 to 200 angstroms per minute are achieved for low pressure processes (less than 1 Torr) as described in "Polycrystalline Silicon for Integrated Circuit Applications" (T. Kamins, Kluwer Academic Publishers, 1988, p. 29). There are also some high pressure processes available (25 to 350 Torr) that can achieve deposition rates up to about 3,000 angstroms per minute as described in detail in U.S. Pat. Nos. 5,576,059 and 5,607,724 and 5,614,257.

Figure 1:
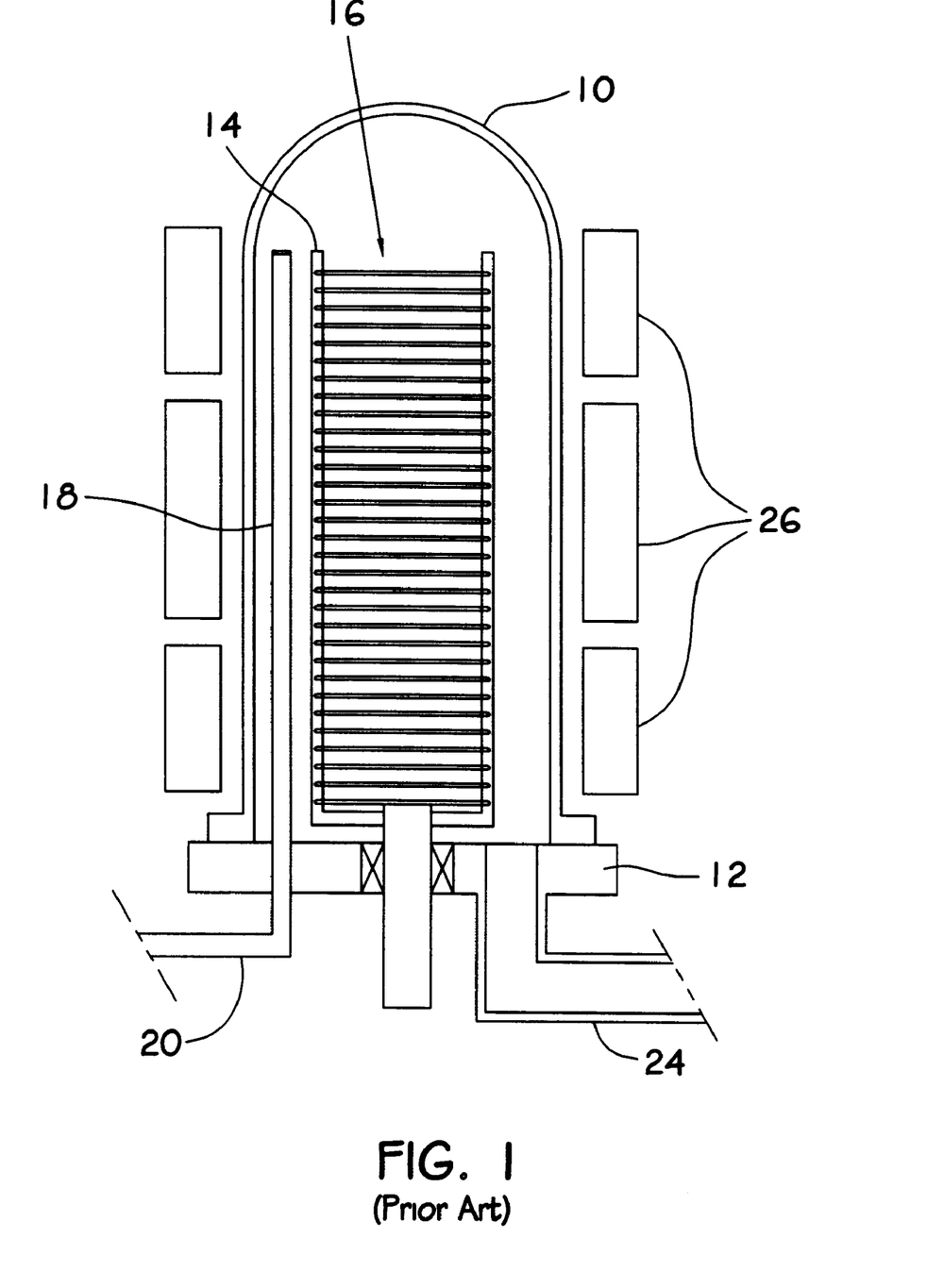
FIG. 1 illustrates a multiple wafer stack prior art reactor.

A typical prior art vertical furnace low pressure chemical vapor deposition (LPCVD) system is depicted in FIG. 1 and includes a chamber consisting of a quartz tube 10 and chamber seal plate 12 into which is inserted a boat 14 for carrying a plurality of substrates 16. Silane or other similar precursor and a carrier gas such as hydrogen and a dopant gas such as phosphine enter the gas injection tube (or tubes) 18 from the gas inlet tube (or tubes) 20 through the chamber seal plate 12. The gases exit the process chamber through the seal plate 12 and out the exhaust port 24. A plurality of heater elements 26 are separately controlled and adjustable to compensate for the well-known depletion of the feed gas concentration as the gas flows from the gas injection tube 18 to the chamber exhaust port 24. This type of deposition system typically operates in the 200 mTorr to 500 mTorr range ($200\times10^{-3}$ Torr to $500\times10^{-3}$ Torr). Operating at this low partial pressure of silane, or other similar precursor, results in low deposition rates of the typically 30 to 200 angstroms per minute for deposition of pure silicon, and 5 to 30 angstroms per minute if a dopant gas is introduced. Operation at higher concentrations of reactant gases results in non-uniform deposition across the substrates and great differences in the deposition rate from substrate to substrate. Increased flow rates could improve the deposition uniformity at higher pressures, however increased gas flow increases the reactive gas pressure at the injection tube holes causing gas phase nucleation resulting in particles being deposited on the substrates. Other problems associated with this reactor include film deposition on the interior quartz tube 10 and gas injection tube 18. This unwanted deposition decreases the partial pressure of the reactive feed gas concentration near the surface of the substrate 16 resulting in a reduced deposition rate and potential contamination caused when film deposited on the wall of tube 10 and injector tube 18 flakes off and deposits on the substrates 16. Finally, to offset the depletion of the reactive chemical species from the entrance to the exit of this style reactor, a temperature gradient is determined across the substrate load zone that gives a uniform deposition rate profile. However, this creates a different problem because, in the case of polysilicon deposition, the grain size is temperature dependent, and this temperature gradient causes the polysilicon grain size to vary across the load zone. This variation in grain size from substrate to substrate within a plurality of substrates can cause problems with subsequent patterning of the polysilicon and variations in the electrical performance of integrated circuits.

Figure 2:
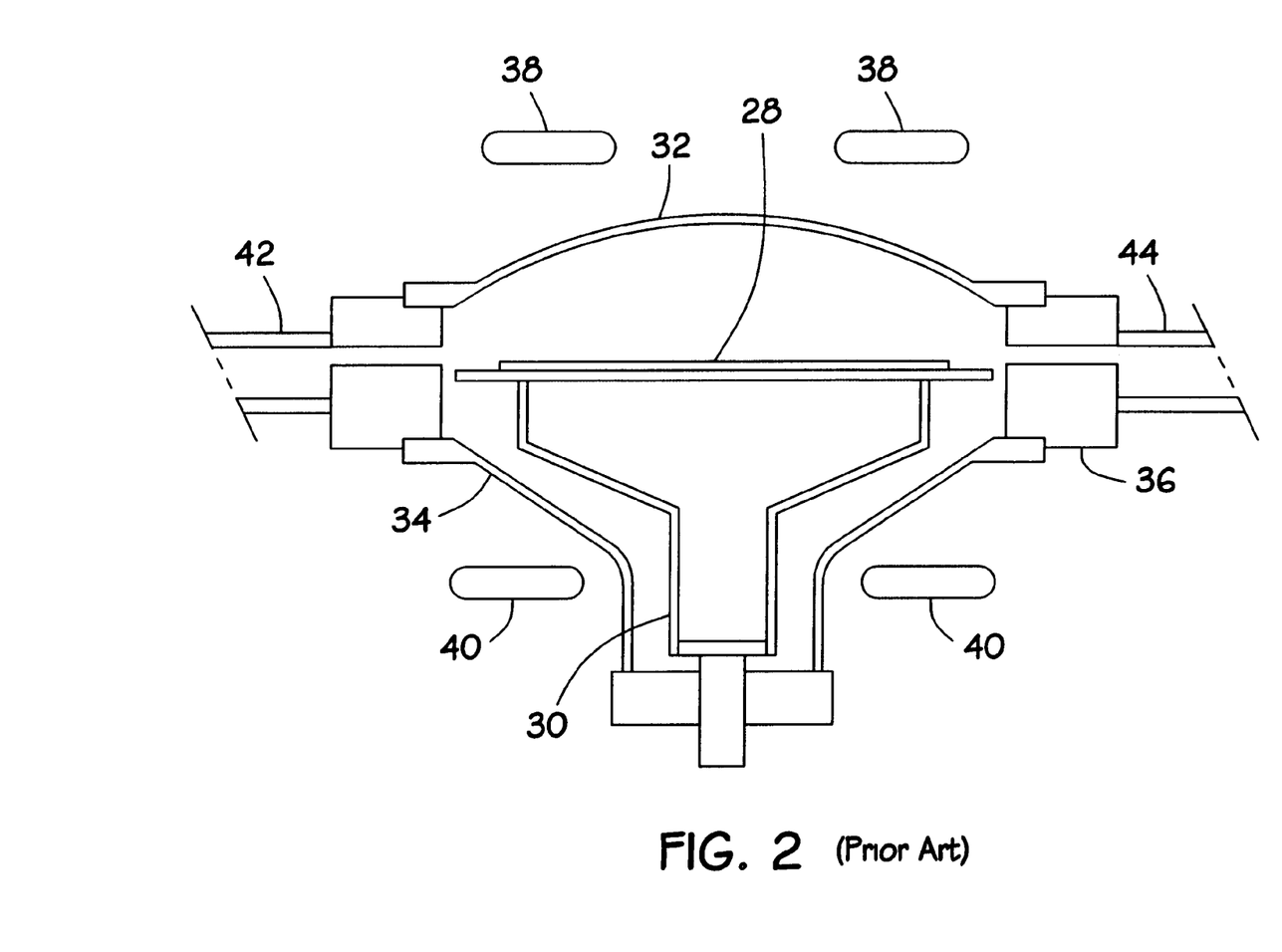
FIG. 2 illustrates a single wafer prior art reactor.

Another prior art reactor is illustrated in FIG. 2 and described in detail in U.S. Pat. No. 5,108,792. A substrate 28 is placed on a rotating substrate carrier 30, enclosed in a vacuum tight chamber having an upper quartz dome 32 and a lower quartz dome 34 and associated chamber wall 36. The substrate 28 is heated by upper lamps 38 and lower lamps 40. Reactant gases are injected through gas input tube 42 and exhausted through exhaust tube 44. This reactor overcomes some of the limitations of the vertical furnace reactor of FIG. 1. The reactor can be operated at higher pressures than vertical LPCVD furnaces and does not have an injector tube and its associated problems. The reactor construction and high rate of deposition at high pressure (typically greater than 10 Torr) is explained in U.S. Pat. Nos. 5,576,059 and 5,607,724 and 5,614,257.

Increased deposition rates result in higher machine productivity and more importantly reduce the time the substrates are exposed to high temperatures, i.e. >600° C. Reduced time at high temperatures is important during the fabrication of semiconductor devices as the device sizes become smaller. Elevated temperatures, i.e. >600° C., for any extended time cause unwanted changes in semiconductor device structure. A disadvantage of the prior art high pressure methods is that operating at high pressure can cause a gas phase reaction which can produce particulate contamination on the wafer.

U.S. Pat. No. 5,551,985 by Brors et al. describes a CVD reactor that provides improved uniformity in heating a wafer, and a highly uniform gas flow across the surface of a wafer. U.S. patent applications Ser. Nos. 08/909,461 filed on Aug. 11, 1997, and 09/228,835 and 09/228,840 filed on Jan. 12, 1999, the disclosures of which are incorporated herein by reference, describe wafer chambers in which related processes may also be used.

SUMMARY OF THE INVENTION

It is an object of the present invention to provide a method of operating a CVD reactor that provides a further improvement in uniform deposition of silicon.

It is a further object of the present invention to provide a method of operating a CVD reactor that optimizes the rate and uniformity of deposition of silicon.

It is a still further object of the present invention to provide a method of operating a CVD reactor that results in a high degree of uniformity in deposition from one run to another.

Briefly, a preferred embodiment of the present invention includes a method of operating a CVD reactor having a high degree of temperature and gas flow uniformity, the method of operation providing a novel combination of wafer temperature, gas flow and chamber pressure. According to the method, a wafer is placed in a vacuum chamber wherein a reactant gas flow is directed in parallel with the wafer via a plurality of temperature controlled gas injectors, at a selected velocity causing the deposition rate to be limited only by the rate of delivery of unreacted gas to the wafer surface and the rate of removal of reaction byproducts. The novel combination of process conditions moves the reaction at the wafer surface into the regime where the deposition rate exceeds the crystallization rate, resulting in very small crystal growth and therefore a very smooth polysilicon film with a surface roughness on the order of 5–7 nm for films 2500 angstroms thick. The process is configured to operate below what is known as the "transition" temperature, at which level each layer of film is deposited in an amorphous form and then crystallizes as the deposition proceeds because of the lower energy of the polycrystalline structure. As a result, the silicon film is crystalline near the interface between the deposited material and the wafer surface, and amorphous near the top surface of the deposited material, resulting in a much smoother surface than can be achieved with prior art commercial equipment.

An advantage of the present invention is that it results in smoother deposited film surfaces.

A further advantage of the present invention is that it provides a process resulting in improved uniformity in film deposition from batch to batch.

A still further advantage of the present invention is that it provides a method resulting in higher rate deposition of silicon with improved film smoothness and reproducability between batches.

DETAILED DESCRIPTION OF THE PREFERRED EMBODIMENTS

Figure 3:
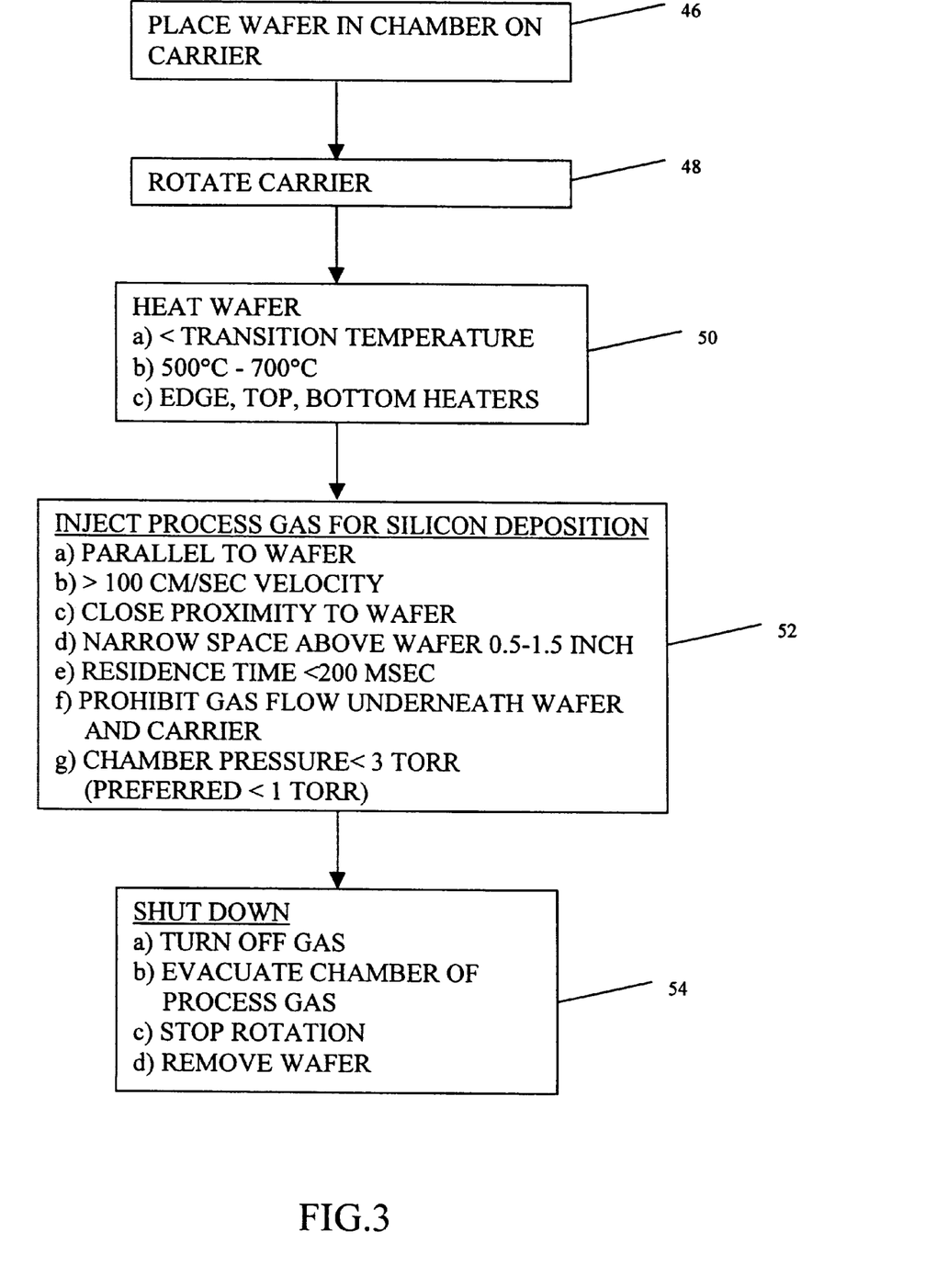
FIG. 3 is a flow chart illustrating the steps of the preferred embodiment of the present invention.

The method of the present invention will now be described in reference to the flow chart of FIG. 3. The process begins by placing a wafer on a carrier in a deposition chamber 46, for deposition of polysilicon and/or amorphous silicon. The carrier is rotated (48) and heated (50). The order of steps 48 and 50 is not significant in that the rotation is for the purpose of enhancing the uniformity of silicon deposition, and may be initiated any time prior to the injection of reactant gases and then maintained during the deposition. The wafer is preferably heated as uniformly as possible, with heat sources above, below and surrounding the edge of the wafer. The temperature to which the wafer is heated is preferably below a temperature known as the "transition" temperature, the preferred temperature range for silicon deposition being 500° C.–700° C. The transition temperature will be more fully discussed in the following text of the specification.

When the wafer is at the desired temperature, the process gas for silicon deposition is initiated (52). The gas pressure in the chamber is maintained at a selected pressure less than 3 Torr but preferably less than 1 Torr, and the gas is preferably injected through a plurality of cooled injector nozzles with injection ports in close proximity to the wafer edge, the nozzles oriented so as to direct the flow parallel and close to the wafer surface. The gas is controlled to flow at a velocity in excess of 10 cm/second and preferably at least 50 to 100 cm/second across the wafer surface in a narrow space confined to the region from the wafer surface to a maxiumum space above the wafer of ½" to 1½". The benefits and reasons for this will be fully explained in the following text. The velocity of the gas should be sufficient to reduce the gas residence time to less than 500 milliseconds and preferably less than 200 milliseconds. Subsequent to deposition, the gas is turned off and evacuated from the chamber, the rotation is stopped, and the wafer removed (54).

The results achievable with the method of the present invention as described above in reference to FIG. 3 represent a major improvement in silicon deposition. The term silicon deposition or silicon, etc., will be used in this disclosure as a generic term to include polysilicon, amorphous silicon, and silicon with doping material. As discussed in the section on prior art, previous systems achieved high rates of silicon deposition (1,000–3,000 Å/minute) by running chambers at relatively high pressures, typically in excess of 10 Torr. Silicon deposition occurring at such high pressures has the disadvantage in that it can cause a gas phase reaction which can produce particulate contamination on the wafer. A major advantage of the present invention is that the method provides a very high deposition rate at very low chamber pressures, resulting in very smooth, uniform and consistent surfaces. With the method of the present invention, deposition rates of 3,000 Å/minute are achieved at chamber pressures in the range of 300–700 mTorr. Film uniformity is typically 1%, measured between the center of a 200 mm diameter silicon wafer and a point 3 mm from the edge of the wafer. The reasons for this improved performance will now be described in detail, referring to each of the critical parameters of pressure, temperature and gas velocity.

In accordance with the present invention, a wafer/substrate is placed on a rotatable carrier in a vacuum chamber wherein a high velocity reactant gas for depositing silicon, such as silane, and a dopant gas if required, enter the reactor/chamber in relatively close proximity to the rotated, heated wafer. The gas is injected across the wafer at a velocity in excess of 10 cm/second and preferably 50 to 100 cm/second or more, and is confined to a very narrow region above the wafer so as to maximize the gas concentration at the wafer surface. According to the method, the reactant gas is preferably confined to the region extending from the wafer surface to ½", but no more than 1½" above the wafer. The high velocity gas stream passing across the wafer surface has the effect of thinning what is known as a "boundary layer" immediately above the wafer. The boundary layer is a region wherein unwanted reaction by-products collect. This layer normally slows the rate of incidence of reactant gas, and thereby slows the rate of deposition. The high velocity gas stream of the present invention sweeps out the unwanted by-products, thinning the boundary layer, allowing a higher rate of desired reactant gas to reach the wafer surface, i.e., resulting in a further increase in the relative concentration of the desired reactant species and reduced incorporation of unwanted reaction by-products in the deposited film.

The combination of elements of the method of the present invention are selected to achieve a more uniform, smooth film. For example, the rapid gas flow described above, in combination with a chamber pressure of about 260 mTorr and a process temperature about 650° C. changes the character of the deposition from that of the prior art, moving it into a regime where the reaction is occurring below what is known as a "transition" temperature where the deposition rate exceeds the crystallization rate, providing the benefit of an unusually small amount of crystal growth. The result is a very smooth polysilicon film with a surface roughness on the order of 5–7 nm for films 2,500 Å thick. In contrast, the nominal surface roughness using a conventional prior art method is approximately 70 nm as noted in the book "Polycrystalline Silicon for Integrated Circuit Applications" by Ted Kamins, page 54.

The nature and background of the phenomenon known as the "transition" temperature will now be described in further detail, and how the method of the present invention provides for operation in this region.

In prior art methods of chemical vapor deposition (CVD) of silicon, during the CVD deposition of silicon at a given pressure, there is a transition temperature that when exceeded will deposit a polycrystalline structure as the deposition proceeds. In such a case, the underlying silicon atoms are unlikely to continue rearranging after they have been covered by further layers of deposited silicon atoms. This is an undesirable result, causing a rough film surface. However, in films deposited slightly below the transition temperature, each layer of the film is deposited in an amorphous form and crystallizes as the deposition proceeds because of the lower energy of the polycrystalline structure. Nucleation of crystallites is most likely to occur by heterogeneous nucleation at the lower silicon-silicon dioxide interface. Crystallization of the amorphous silicon proceeds from these initial nuclei, with the crystalline region propagating upward into the film by solid-phase epitaxial growth. When the crystallization rate is less than the deposition rate, only the lower portion of the film (starting from the silicon-silicon dioxide interface) crystallizes during deposition, even though the crystallization process continues during the subsequent heating that occurs after the deposition is terminated by shutting off the silane flow. Thus, the silicon film can be crystalline near the interface and amorphous near the top surface resulting in a very smooth surface texture that is five to ten times smoother than the typical values obtained from conventional polysilicon deposited films carried out in presently available commercial equipment. Although it is known that operation below the transition temperature can result in a smooth film surface, prior art equipment and methods do not allow such operation in a practical application because the deposition rate is very slow. According to the prior art, high deposition rates of 3,000 Å/minute are only possible with chamber pressures above 10 Torr. In contrast, the method of the present invention provides a combination of elements, including rapid application of reactant gas and removal of unwanted by-products, reducing the boundary layer, operation between 500° C.–700° C. and at a pressure less than 3 Torr that results in operation below the transition temperature at a very high deposition rate in a range including 3,000 Å/minute. The non-uniformity of the deposited silicon layer is less than 1.5%, measured between the center of the wafer and a point 3 mm from the edge of a 200 mm diameter wafer. The surface roughness is in the order of 5–7 nm for a film 2,500 Å thick, deposited at a chamber pressure of 1 Torr or less.

Figure 4:
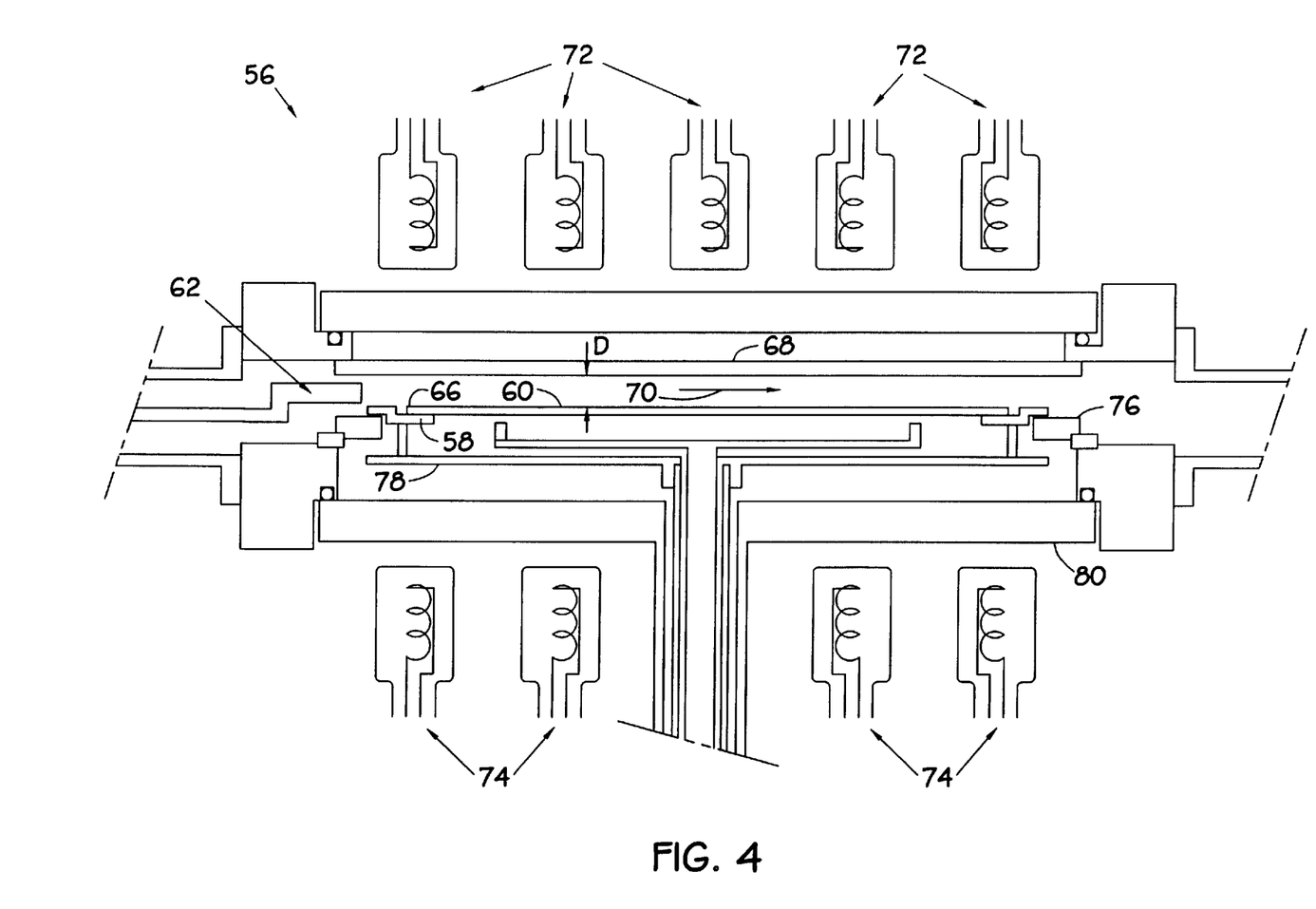
FIG. 4 shows a reactor that can be used to implement the method of the present invention.

The development of the method of the present invention was accomplished through use of a reactor similar to that shown in the cross-sectional view of FIG. 4. The structure of this apparatus is described in detail in U.S. Pat. No. 5,551,985. According to the method, a reactant gas is injected in close proximity to the edge of the wafer, and directed across and parallel to the wafer surface at a high velocity, confined to a narrow region above the wafer. FIG. 4 shows a reactor 56 having a rotatable susceptor 58 upon which is placed a wafer 60. A gas injector apparatus 62 including a plurality of nozzles with jets/openings 64, is positioned in close proximity to the wafer edge 66, and is oriented to direct a flow of reactant gas across and parallel to the wafer 60. The gas is further confined to a narrow region of width D above the wafer surface by a thermal plate 68 positioned over the wafer. By experiments with the positioning of plate 68, it was determined that the optimum gap D lies between ½" and 1½". Similarly by experiment, the speed of gas flow from injector 62 across the wafer was found to optimally exceed 50 to 100 cm/second in the direction indicated by arrow 70, for the purposes of optimum reactant gas supply to the wafer surface and removal of reaction by-products according to the method described above.

According to the order of operations described in reference to FIG. 1, the substrate/wafer 60 is first placed on a carrier 58 and then brought to an operating temperature between 500° C. and 700° C. Typically, the apparatus of FIG. 1 can reach the temperature in about 20 seconds. The apparatus as shown in FIG. 4 includes heaters 72 above, 74 below, and a heat block 76 surrounding the carrier. This combination provides uniform heating of the wafer 60. The carrier is then rotated at a speed of approximately 5 RPM, and the reactant gas is injected. The method of the present invention minimizes deposition on chamber surfaces by specifying that the reactant gas be confined to a narrow region above the substrate. The apparatus of FIG. 4 further assists in this objective by blocking reactant gas from passing underneath the substrate. This is accomplished by injecting a non-reactive gas (argon) at a low pressure under the substrate, between thermal plate 78 and lower quartz window 80. The details of the apparatus construction are fully described in U.S. Pat. No. 5,551,985.

Figure 5:
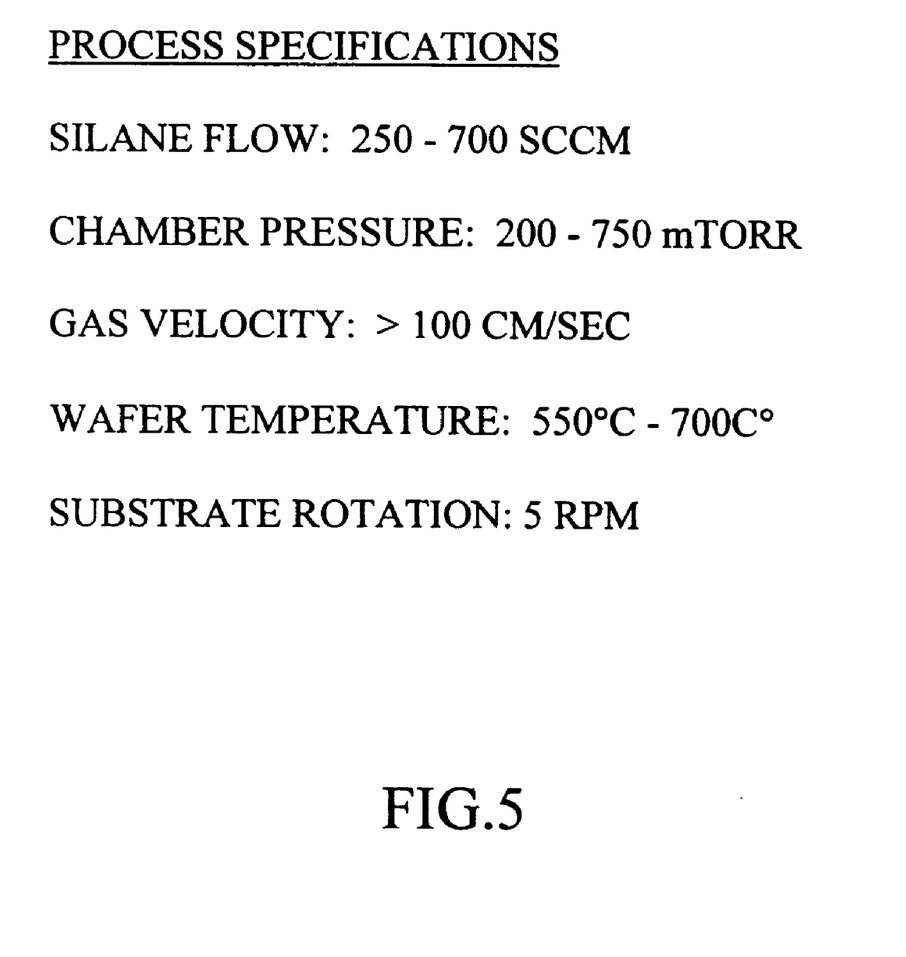
FIG. 5 is a list of operating parameters according to the present invention.

The preferred specifications for the method according to the present invention are listed in FIG. 5, including a silane flow rate in the range of 250–700 sccm, a chamber pressure in the range of 200–750 mTorr, a gas velocity in excess of 100 cm/second confined to ½" over the wafer yielding a gas residence time of less than 200 msec, a wafer uniformly heated to a temperature in the range of 550° C.–700° C., and wafer rotation at a preferred rate of 5 RPM. Other rotation speeds are also included in the spirit of the present invention.

Other factors that contribute to the performance of the method applied to the apparatus of FIG. 4 include the plurality of water-cooled injector nozzles, prevention of reactant gas flow underneath the wafer, gas nozzles/jets directed across and positioned close to the ends of the wafer, and uniform wafer heating with heaters above, below, and around the edge of the wafer.

Figure 6:
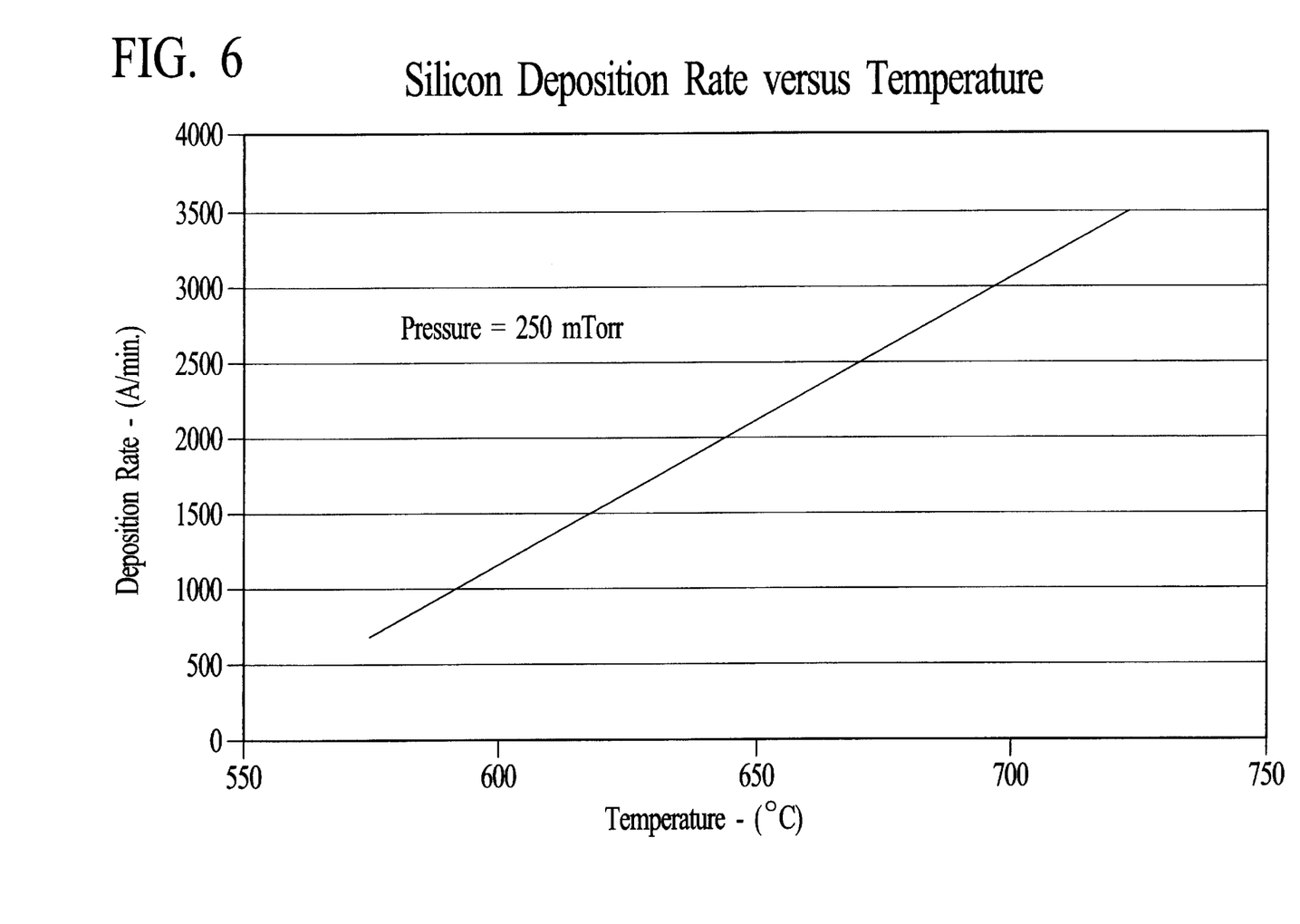
FIG. 6 is a graph of deposition rate vs temperature.
Figure 7:
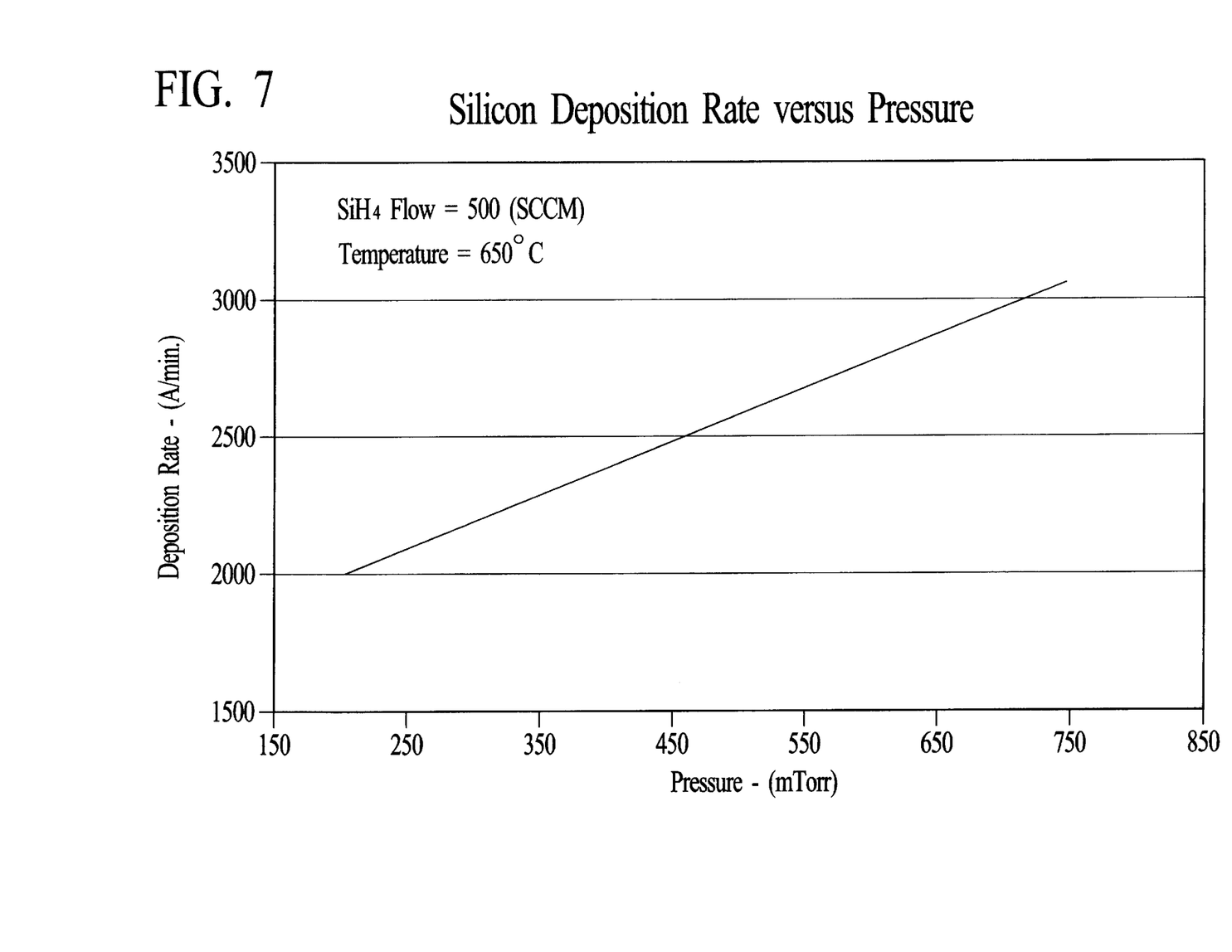
FIG. 7 is a graph of deposition rate vs pressure.

Various performance factors are illustrated in the graphs of FIGS. 6–10. FIG. 6 shows the silicon deposition rate versus wafer temperature with a chamber pressure of 250 mTorr. It can be seen that the deposition rate is a rapid function of temperature at 250 mTorr and therefore fairly critical. FIG. 7 shows the deposition rate versus chamber pressure at a temperature of 650° C.

Figure 8:
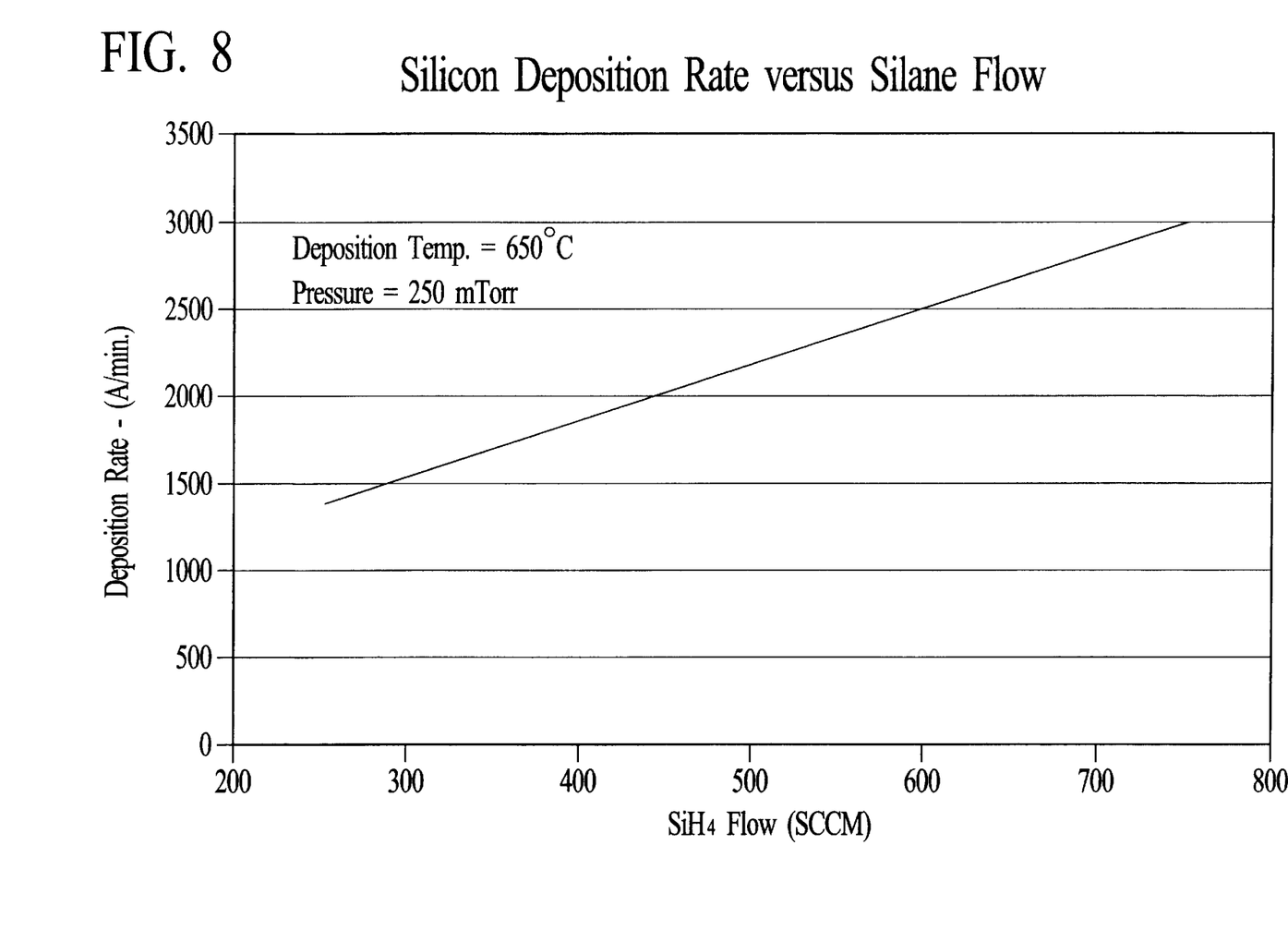
FIG. 8 is a graph of deposition rate vs silane flow.

FIG. 8 shows the deposition rate as a function of silane flow, which is proportional to the gas velocity over the wafer.

Figure 9:
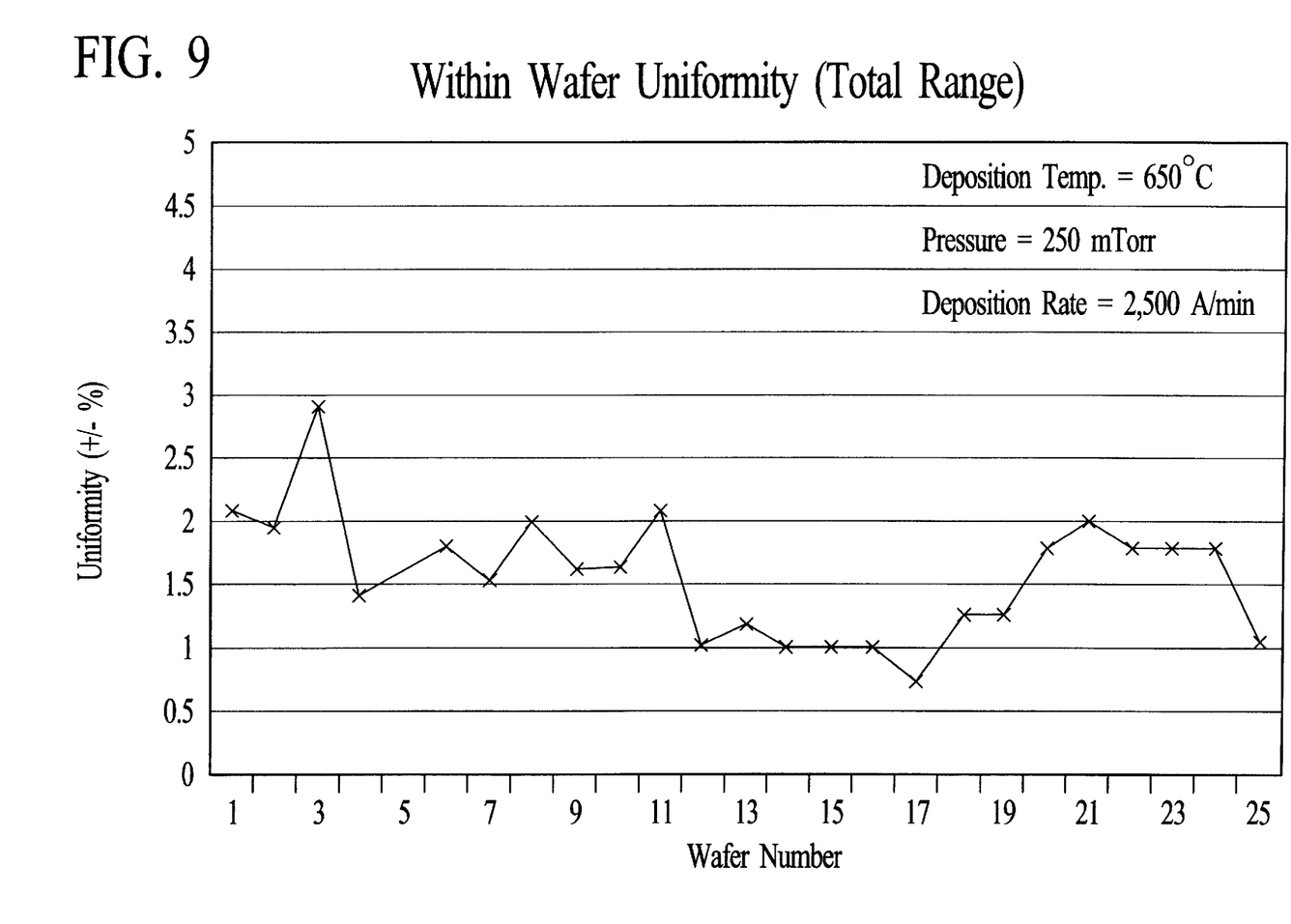
FIG. 9 is a plot showing film thickness variations for a number of wafers.

FIG. 9 is a plot of the deposition thickness variation within each wafer, for 25 wafers. The maximum film thickness variation as shown is approximately 2.9%, with an average variation around 1.5%.

Figure 10:
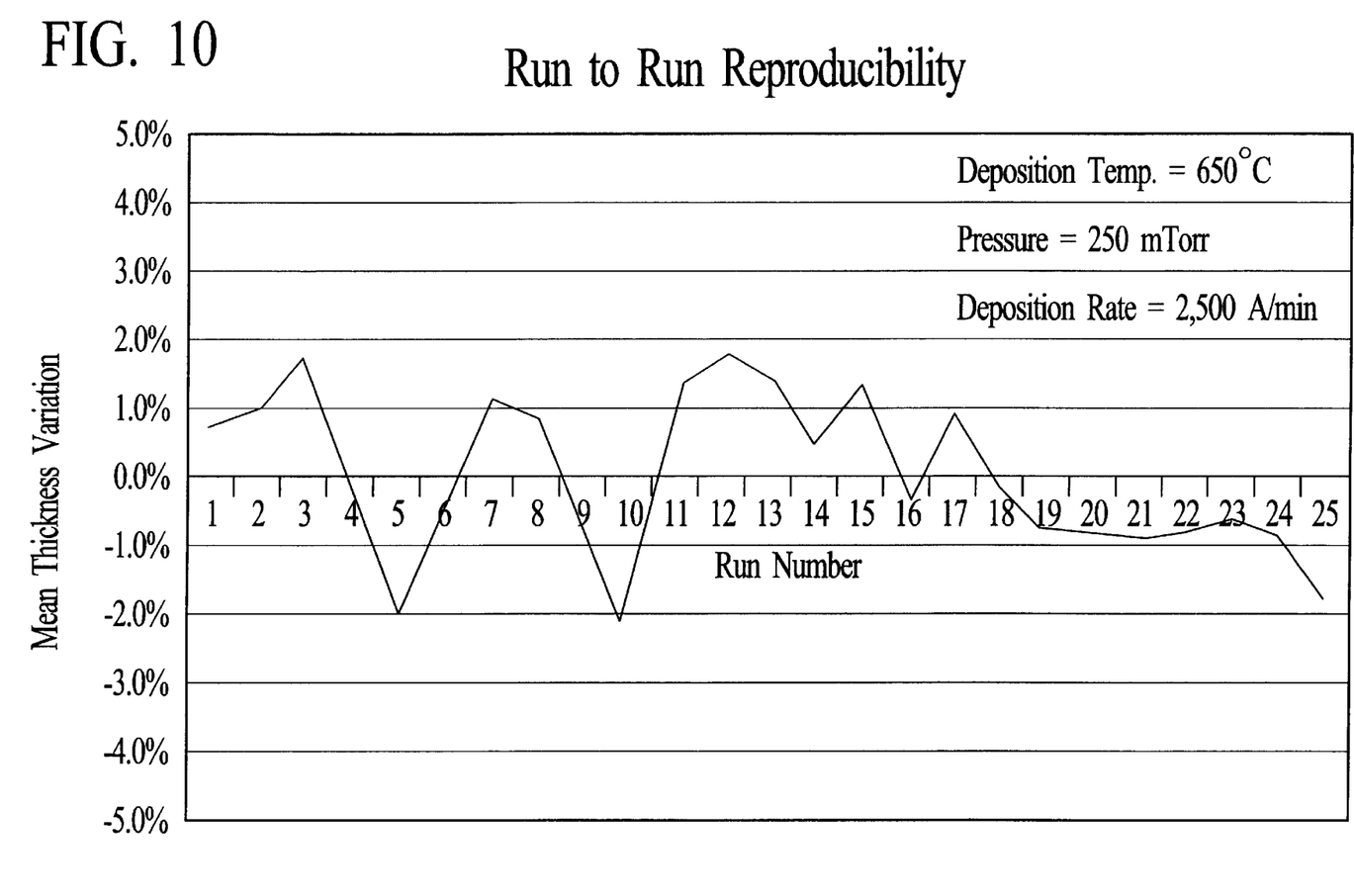
FIG. 10 is a plot showing the variation in thickness for each of a number of wafers, from an average value.

FIG. 10 shows the variation in average film deposition thickness from one wafer to another for 25 wafers. The maximum deviation from the average for the batch is about 2%.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of depositing silicon, comprising: depositing silicon on a wafer including the steps of
   (a) placing a wafer on a carrier in a deposition chamber;
   (b) rotating said carrier about a central axis of said carrier for equalizing distribution of a process gas over said wafer;
   (c) heating said wafer to a temperature of at least 500° C. but below a transition temperature below which a deposition rate of silicon exceeds a crystallization rate;
   (d) injecting said process gas substantially parallel to a surface of said wafer at a velocity of at least 10 cm/sec with a pressure in said deposition chamber at a value less than 3 torr.

2. A method as recited in claim 1 wherein said wafer is heated to a temperature between 500° C. and 700° C.

3. A method as recited in claim 1 wherein said velocity is adjusted to cause an average gas resident time of said process gas in said deposition chamber of less than 500 milliseconds.

4. A method as recited in claim 1 wherein said process gas is introduced into said chamber at a flow rate in the range of 250 to 700 sccm.

5. A method as recited in claim 1 wherein said wafer is heated to a temperature in the range of 650° C. to 700° C.

6. A method as recited in claim 1 wherein said chamber pressure is maintained in the range from 200–750 mTorr while said process gas is being introduced into said chamber.

7. A method as recited in claim 1 wherein said process gas is introduced to a plurality of gas nozzles configured to extend toward an edge of said wafer.

8. A method as recited in claim 7 wherein said gas nozzles are temperature-controlled.

9. A method as recited in claim 7 wherein said gas nozzles are water-cooled.

10. A method as recited in claim 7 wherein said gas nozzles are configured to affect said substantial parallelism to cause said gas stream to be directed at said surface of said wafer.

11. A method as recited in claim 10 wherein a distance between the wafer and an upper heat shield is less than 1½".

12. A method as recited in claim 7 wherein a plurality of reactant gases enter through a plurality of separate nozzles for each reactant gas.

13. A method as recited in claim 12 wherein a distance between the wafer and an upper heat shield is less than 0.6".

14. A method as recited in claim 1 wherein a dopant gas is introduced to a gas nozzle configured to extend toward an edge of said wafer.

15. A method as recited in claim 1 wherein said process gas is concentrated at a deposition surface of the wafer.

16. A method as recited in claim 1 wherein the process gas is prevented from passing below the wafer.

17. A method as recited in claim 1 wherein said process gas passing across said wafer is confined to within 1½ inches above said wafer.

18. A method as recited in claim 1 wherein said process gas passing across said wafer is confined to within 1 inch above said wafer.

19. A method as recited in claim 1 wherein said process gas passing across said wafer is confined to within ½ inch above said wafer.

* * * * *